United States Patent
Murakami et al.

(10) Patent No.: US 8,236,912 B2
(45) Date of Patent: Aug. 7, 2012

(54) GAS-BARRIER FILM AND ENVIRONMENT-SENSITIVE DEVICE

(75) Inventors: Tomoo Murakami, Kanagawa (JP); Yuya Agata, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 951 days.

(21) Appl. No.: 12/251,248

(22) Filed: Oct. 14, 2008

(65) Prior Publication Data

US 2009/0095345 A1 Apr. 16, 2009

(30) Foreign Application Priority Data

Oct. 16, 2007 (JP) ................................. 2007-268979

(51) Int. Cl.
*H01L 31/042* (2006.01)
*C08F 118/14* (2006.01)
(52) U.S. Cl. ...................... 526/318; 526/348.1; 136/251
(58) Field of Classification Search .................. 526/318, 526/348.1; 136/251
See application file for complete search history.

(56) References Cited

FOREIGN PATENT DOCUMENTS

| JP | 2000-063450 | A | | 2/2000 |
|---|---|---|---|---|
| JP | 2002-264274 | | * | 9/2002 |
| JP | 2003-335880 | A | | 11/2003 |
| JP | 2004-244606 | | * | 9/2004 |
| JP | 2005-022375 | A | | 1/2005 |
| JP | 2006-289627 | A | | 10/2006 |

OTHER PUBLICATIONS

Japanese Office Action dated Jan. 10, 2012, issued in corresponding Japanese patent application No. 2007-268979 (English translation attached).

* cited by examiner

*Primary Examiner* — Ling Choi
*Assistant Examiner* — Wenwen Cai
(74) *Attorney, Agent, or Firm* — Birch, Stewart, Kolasch & Birch, LLP

(57) ABSTRACT

Provided is a gas-barrier film having a high barrier property when it is folded. The gas barrier film is characterized in that an organic layer comprises a resin obtained by curing a monomer as a polymerizing ingredient and the monomer has a structure of pentahydric alcohol or more polyhydric alcohol having a molecular weight of from 200 to 800 in which at least 5 hydroxyl groups are substituted with an aliphatic carbonyloxy group of the following general formula (1):

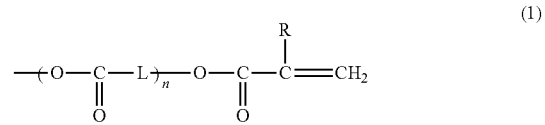

wherein R represents a hydrogen atom or a methyl group; L represents a linking group having a chain length of at least 4 atoms; n indicates 0 or 1; provided that at least 3 hydroxyl groups of the polyhydric alcohol are substituted with the aliphatic carbonyloxy group of formula (1), when n =1.

13 Claims, No Drawings

GAS-BARRIER FILM AND ENVIRONMENT-SENSITIVE DEVICE

FIELD OF THE INVENTION

The present invention relates to a gas-barrier film having an excellent gas-barrier property and applicable to environment-sensitive devices and others that may be influenced by oxygen and water to change their capabilities. In particular, the invention relates to a gas-barrier film capable of maintaining its good gas-barrier property even when folded, and to an environment-sensitive device, especially an organic EL device comprising the gas-barrier film.

BACKGROUND ART

Recently, in organic devices such as liquid-crystal display devices, solar cells and electroluminescent (EL) devices, use of transparent plastic films that are thin and light and are excellent in flexibility, as substrates in place of glass substrates that are heavy and readily cracked or broken, has been investigated. Transparent plastic substrates can be readily processed into large size panels and are applicable to a roll-to-roll production system, and therefore they are more advantageous than glass substrates in point of the producibility and cost reduction.

However, transparent plastic substrates are problematic in that their gas-barrier property is inferior to the gas-barrier property of glass. In general, the constitutive materials of organic devices may be often deteriorated or transubstantiated by water or air. For example, when a substrate having a poor gas-barrier property is used as a substrate of a liquid-crystal display device, then the liquid crystal in the liquid-crystal cell may be deteriorated and the deteriorated sites may form display faults to thereby worsen the display quality of the device.

For solving the problem, the above-mentioned plastic film substrate itself may be modified to have a gas-barrier function by itself, or the device may be wholly sealed up with a transparent plastic film having a gas-barrier property. As a gas-barrier film, generally known is one produced by forming a thin film of a metal oxide on a plastic film. As a gas-barrier film for use for liquid-crystal display devices, for example, there are known a plastic film coated with silicon oxide through vapor deposition (for example, see JP-B 53-12953 (pp. 1-3)), and a plastic film coated with aluminium oxide through vapor deposition (for example, JP-A 58-217344 (pp. 1-4)). These films have a water-vapor barrier level of 1 g/m²/day or so in terms of the water-vapor permeability thereof. Recently, however, development of organic EL displays and high-definition color liquid-crystal displays that require higher barrier capabilities has been advanced, and substrates having high barrier capabilities and usable for them have become required.

To satisfy these requirements, a gas-barrier film comprising an organic layer and an inorganic layer laminated on a plastic substrate has been developed. For example, a technique of providing a gas-barrier film that is excellent in transparency and flexibility and is hardly influenced by temperature/humidity changes has been developed, for which is used a resin prepared by curing a 6-functional acrylate or methacrylate monomer in forming the organic layer of the film (see JP-A 2002-264274). Another technique has also been developed for providing a gas-barrier film of good producibility that has a smooth surface and is transparent and flexible by using a resin prepared by curing a bifunctional or more multifunctional acryloyl group in forming the organic layer of the film (see JP-A 2004-244606).

SUMMARY OF THE INVENTION

However, the gas-barrier film described in JP-A 2002-264274 has a moisture permeability of 0.3 g/m²·day or so, and its capability is not satisfactory. In addition, in JP-A 2002-264274, no investigation relating to flexibility is made, and the gas-barrier property of the film is not good when it is folded. The gas-barrier film described in JP-A 2004-244606 has a moisture permeability of less than 10 g/m²·day, and its practicability is problematic.

To solve the above-mentioned problems mentioned in the above, the present inventors have further investigated thereby to provide, as an object of the invention, a gas-barrier film having a sufficient gas-barrier property and capable of maintaining its excellent gas-barrier property even when folded.

The present inventors have assiduously studied and, as a result, have found that the above-mentioned problems can be solved by using, as the organic layer, a resin obtained by curing a specific monomer. Accordingly, the inventors have provided the present invention mentioned below in order to solve the above-mentioned problems.

[1] A gas-barrier film having a structure of an organic layer and an inorganic layer laminated alternately on at least one surface of a plastic film, wherein the organic layer comprises a resin obtained by curing a monomer as a polymerizing ingredient and the monomer has a structure of pentahydric alcohol or more polyhydric alcohol having a molecular weight of from 200 to 800 in which at least 5 hydroxyl groups are substituted with an aliphatic carbonyloxy group of the following general formula (1):

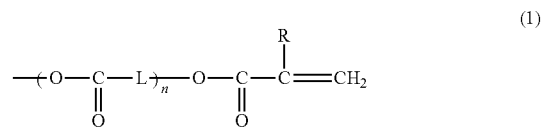

wherein R represents a hydrogen atom or a methyl group; L represents a linking group having a chain length of at least 4 atoms; n indicates 0 or 1; provided that at least 3 hydroxyl groups of the polyhydric alcohol are substituted with the aliphatic carbonyloxy group of formula (1), where n = 1.

[2] The gas-barrier film of [1], wherein the polyhydric alcohol has a neopentyl skeleton.

[3] The gas-barrier film of [1], wherein the polyhydric alcohol is dipentaerythritol.

[4] The gas-barrier film of any one of [1] to [3], wherein L is a linear alkylene group having at least 4 carbon atoms.

[5] The gas-barrier film of any one of [1] to [4], wherein the center line mean roughness of the inorganic layer on the organic layer is at most 2.0 nm.

[6] The gas-barrier film of any one of [1] to [5], wherein the water vapor permeability of the gas-barrier film after folded to have a radius of curvature of 20 mm is at most 0.005 g/m²·day.

[7] The gas-barrier film of any one of [1] to [6], wherein the organic layer has a thickness falling within a range of from 50 nm to 5000 nm.

[8] The gas-barrier film of any one of [1] to [7], wherein the rate of polymerization of the organic layer is at least 96%.

[9] The gas-barrier film of any one of [1] to [8], wherein the inorganic layer has a thickness falling within a range of from 2 to 300 nm.

[10] The gas-barrier film of any one of [1] to [9], wherein the plastic film has an easy-adhesive layer on the surface thereof.

[11] The gas-barrier film of [10] wherein the easy-adhesive layer has a two-layered structure, and the binder in the first layer adjacent to the plastic film is a polyester and the binder in the second layer just on it is an acrylic resin or an urethane resin.

[12] An environment-sensitive device comprising the gas-barrier film of any one of [1] to [11].

[13] An organic EL device comprising the gas-barrier film of any one of [1] to [11].

The gas-barrier film of the invention has an excellent gas-barrier property and is characterized in that, even when folded, it still maintains its excellent gas-barrier property. The environment-sensitive device of the invention comprising the gas-barrier film has excellent durability.

DESCRIPTION OF THE PREFERRED EMBODIMENTS

The contents of the invention are described in detail hereinunder. In this description, the numerical range expressed by the wording "a number to another number" means the range that falls between the former number indicating the lowermost limit of the range and the latter number indicating the uppermost limit thereof.

[Function and Constitution of Gas-Barrier Film]

The gas-barrier film of the invention is a film having, on at least one surface of a plastic film, a barrier layer having the function of preventing oxygen and moisture in air from penetrating therethrough.

The barrier layer in the invention has a structure of at least an organic layer and an inorganic layer laminated alternately. Preferably, plural organic layers and inorganic layers are alternately laminated to constitute the barrier layer. The barrier layer may be so designed that an organic layer and an inorganic layer are laminated on a plastic film in that order, or an inorganic layer and an organic layer are laminated on a plastic film in that order.

The boundary (interface) between the organic layer and the inorganic layer in the invention may not be always definite, but may have a mixed region of an organic compound and an inorganic compound thereby functioning as a barrier layer as a whole. For example, the ratio of the organic compound to the inorganic compound in the boundary may continuously change in the direction of the film thickness. As examples of the case, there are mentioned embodiments described in Kim et al's report, Journal of Vacuum Science and Technology A Vol. 23, pp. 971-977 (2005 American Vacuum Society); and continuous layers of an organic layer and an inorganic layer laminated with no boundary therebetween as in US Laid-Open 2004-46497. In the case where such a mixed region of an organic compound and an inorganic compound is provided, the mixed region preferably has a structure in which the region having a larger organic compound content and the region having a larger inorganic compound content alternately appear in the direction of the thickness of the film.

Not specifically defined, the number of the barrier layers to constitute the barrier film may be typically from 2 to 30, more preferably from 3 to 20. The barrier layers may be provided only on one surface of the plastic film, or on both surfaces thereof.

[Plastic Film]

In the gas-barrier film of the invention, a plastic film is used as the substrate film. The plastic film to be used is not particularly limited with respect to the material quality and thickness, etc. so far as it is a film capable of keeping a laminate of an organic layer, an inorganic layer and the like and can be properly chosen depending upon the use purpose or the like. Specific examples of the plastic film include; and thermoplastic resins such as polyester resins, methacrylic resins, methacrylic acid-maleic acid copolymers, polystyrene resins, transparent fluorocarbon resins, polyimides, fluorinated polyimide resins, polyamide resins, polyamide-imide resins, polyetherimide resins, cellulose acylate resins, polyurethane resins, polyetheretherketone resins, polycarbonate resins, alicyclic polyolefin resins, polyarylate resins, polyethersulfone resins, polysulfone resins, cycloolefin copolymers, fluorene ring-modified polycarbonate resins, alicyclic modified polycarbonate resins, fluorene ring-modified polyester resins and acryloylated compounds.

In the case where the gas-barrier film of the invention is used as a substrate of a device such as organic EL devices as described later, it is preferable that the plastic film is composed of a raw material with heat resistance. Specifically, it is preferable that the plastic film is composed of a transparent raw material with high heat resistance having a glass transition temperature (Tg) of 100° C. or higher and/or a linear heat expansion coefficient of not more than 40 ppm/° C. The Tg and linear heat expansion coefficient can be adjusted by an additive or the like. Examples of such a thermoplastic resin include polyethylene naphthalate (PEN: 120° C.), polycarbonate (PC: 140° C.), alicyclic polyolefins (for example, ZEONOR 1600, manufactured by Zeon Corporation: 160° C.), polyarylate (PAr: 210° C.), polyethersulfone (PES: 220° C.), polysulfone (PSF: 190° C.), cycloolefin copolymers (COC: a compound described in Example 1 of JP-A-2001-150584: 162° C.), polyimides (for example, NEOPULIM, manufactured by Mitsubishi Gas Chemical Company, Inc.: 260° C.), fluorene ring-modified polycarbonate (BCF-PC, a compound described in JP-A-2000-227603: 225° C.), alicyclic modified polycarbonate (IP-PC, a compound described in JP-A-2000-227603: 205° C.) and acryloyl compound (a compound described in JP-A-2002-80616: 300° C. or higher) (the numerical figure in each of the parentheses indicates Tg). In particular, in the case where the transparency is required, it is preferable to use an alicyclic polyolefin or the like.

In the case where the gas-barrier film of the invention is used in combination with a polarizing plater it is preferable that the gas-barrier layer surface of the gas-barrier film (surface on which the laminate including at least one inorganic layer and at least one organic layer is formed) is faced at the inside of a cell and is disposed in the innermost (adjacent to the device). At that time, since the gas-barrier film is disposed in the inside of the cell relative to the polarizing plate, a retardation value of the gas-barrier film is important. As to a use form of the gas-barrier film in such an embodiment, it is preferable that a barrier film using a base material film having a retardation value of not more than 10 nm and a circular polarizing plate ((quarter-wave plate)+(half-wave plate)+(linear polarizing plate)) are laminated and used, or that a linear polarizing plate is combined with a gas-barrier film using a base material film having a retardation value of from 100 nm to 180 nm, which can be used as a quarter-wave plate, and used.

Examples of the substrate film having a retardation of not more than 10 nm include cellulose triacetate (FUJITAC, manufactured by Fujifilm Corporation), polycarbonates (PURE-ACE, manufactured by Teijin Chemicals Ltd.; and ELMECH, manufactured by Kaneka Corporation), cycloolefin polymers (ARTON, manufactured by JSR Corporation; and ZEONOR, manufactured by Zeon Corporation), cycloolefin copolymers (APEL (pellet), manufactured by Mitsui Chemicals, Inc.; and TOPAS (pellet), manufactured by Polyplastics Co., Ltd.), polyarylates (U100 (pellet), manufactured by Unitika Ltd.) and transparent polyimides (NEOPULIM, manufactured by Mitsubishi Gas Chemical Company).

Also, films obtained by properly stretching the foregoing film to adjust it so as to have a desired retardation value can be used as the quarter-wave plate.

In view of the matter that the gas-barrier film of the invention is utilized as a device such as organic EL devices, the plastic film must be transparent, namely its light transmittance is usually 80% or more, preferably 85% or more, and more preferably 90% or more. The light transmittance can be measured by a method described in JIS-K7105, namely by measuring a total light transmittance and an amount of scattered light using an integrating sphere type light transmittance analyzer and subtracting the diffuse transmittance from the total light transmittance.

Even in the case where the gas-barrier film of the invention is used for display use, for example, when it is not disposed on the side of an observer, the transparency is not always required. Accordingly, in such case, an opaque material can also be used as the plastic film. Examples of the opaque material include polyimide, polyacrylonitrile and known liquid crystal polymers.

The thickness of the plastic film to be used for the gas-barrier film of the invention is properly chosen depending upon the use and therefore, is not particularly limited. It is typically from 1 to 800 μm, and preferably from 10 to 200 μm. These plastic films may have a functional layer such as a transparent conductive layer and a primer layer. The functional layer is described in detail in paragraphs 0036 to 0038 of JP-A-2006-289627. Examples of functional layers other than these layers include a matting agent layer, a protective layer, an antistatic layer, a smoothening layer, an adhesion improving layer, a light shielding layer, an antireflection layer, a hard coat layer, a stress relaxing layer, an antifogging layer, an antifouling layer, a layer to be printed and an easily adhesive layer.

[Easy-Adhesive Layer]

The gas-barrier film of the invention may have an easy-adhesive layer on the plastic film for the purpose of enhancing the adhesiveness (stickiness) between the plastic film and the barrier layer. The easy-adhesive layer is a type of a layer that may also be referred to as a primer layer, an undercoat layer, a subbing layer or the like, and this is effective not only for enhancing the adhesiveness but also for controlling the interfacial condition of the laminate.

The easy-adhesive layer indispensably contains a binder, and may optionally contain a mat agent, a surfactant, an antistatic agent, fine particles for controlling refractivity, etc. The binder is not specifically defined, and may be acrylic resin, polyurethane resin, polyester resin, rubber resin, etc.

Acrylic resin is a polymer comprising, as the constitutive ingredients thereof, any of acrylic resin, methacrylic resin and their derivatives. Concretely, for example, it is a polymer comprising, as the main ingredient thereof, any of acrylate, methacrylate, methyl methacrylate, ethyl acrylate, butyl acrylate, 2-ethylhexyl acrylate, acrylamide, acrylonitrile, hydroxylacrylate or the like, and copolymerized with a monomer copolymerizable with them (e.g., styrene, divinylbenzene).

Polyurethane resin is a generic term for polymer having an urethane bond in the main chain thereof, and in general, it is produced through reaction of polyisocyanate and polyol. The polyisocyanate includes TDI (tolylene diisocyanate), MDI (methyldiphenyl isocyanate), HDI (hexylene diisocyanate), IPDI (isophorone diisocyanate), etc.; and the polyol includes ethylene glycol, propylene glycol, glycerin, hexanetriol, trimethylolpropane, pentaerythritol, etc. As the polyurethane resin in the invention, also usable is a polymer prepared by further processing a polyurethane polymer, which is produced through reaction of polyisocyanate and polyol, for chain-extending reaction to thereby increase the molecular weight thereof.

Polyester resin is a generic term for polymer having an ester bond in the main chain thereof, and in general, it is produced through reaction of polycarboxylic acid and polyol. The polycarboxylic acid includes, for example, fumaric acid, itaconic acid, adipic acid, sebacic acid, terephthalic acid, isophthalic acid, naphthalenedicarboxylic acid, etc.; and the polyol includes those mentioned in the above.

The rubber resin for use in the invention is a diene-based synthetic rubber falling within a category of synthetic rubber. Concretely, it includes polybutadiene, styrene-butadiene copolymer, styrene-butadiene-acrylonitrile copolymer, styrene-butadiene-divinylbenzene copolymer, butadiene-acrylonitrile copolymer, polychloroprene, etc.

Not specifically defined, the thickness of the easy-adhesive layer may be generally from 10 to 6000 nm, preferably from 20 to 4000 nm, more preferably from 30 to 2000 nm.

In the invention, the easy-adhesive layer may have a two-layered or more multi-layered structure. In this case, the plural layers may be formed of different resins, or in these, the composition ratio of the constitutive resins may differ. Preferably, the first layer is formed of a polyester layer, and the second layer is formed of an acrylic resin or an urethane resin. In this case, preferably, the thickness of the first layer is from 10 to 500 nm, more preferably from 30 to 150 nm. Also preferably, the thickness of the second layer is from 10 to 5000 nm, more preferably from 20 to 1500 nm.

[Organic Layers]

(Characteristics of Organic Layer)

The organic layer that constitutes the gas-barrier film of the invention is characterized by containing a resin prepared by curing, as the polymerizing ingredient, a monomer that has a structure of pentahydric or more polyhydric alcohol having a molecular weight of from 200 to 800 in which at least 5 hydroxyl groups are substituted with an aliphatic carbonyloxy group of the above-mentioned general formula (1).

(Polyhydric Alcohol)

The polyhydric alcohol as referred to herein must be pentahydric or more; and though not specifically defined, the uppermost limit is at most 20-hydric, preferably at most 15-hydric, more preferably at most 10-hydric, even more preferably at most 7-hydric. The molecular weight of the polyhydric alcohol must be from 200 to 800, but is preferably from 200 to 640, more preferably from 200 to 515, even more preferably from 200 to 400, still more preferably from 230 to 280. Preferably, the polyhydric alcohol comprises a carbon atom, a hydrogen atom and an oxygen atom. In the polyhydric alcohol, the oxygen atom may not be one to constitute a hydroxyl group alone, but may constitute an ether group. The polyhydric alcohol for use in the invention does not have an unsaturated bond, and does not have an ester bond in the molecule.

The polyhydric alcohol preferred for use in the invention is a polyhydric alcohol having a neopentyl skeleton. The neopentyl skeleton as referred to herein means a skeleton having the following structure:

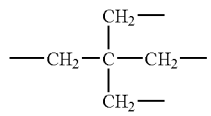

The polyhydric alcohol having a neopentyl skeleton includes dipentaerythritol, tripentaerythritol, tetrapentaerythritol, etc. Preferred are dipentaerythritol and tripentaerythritol, and more preferred is dipentaerythritol.

(Aliphatic Carbonyloxy Group)

The monomer for use in the invention is an ester of the above-mentioned polyhydric alcohol and an acid. Through esterification, at least 5 hydroxyl groups existing in the polyhydric alcohol are derived into the above-mentioned aliphatic carbonyloxy groups of formula (1).

The number of the hydroxyl groups to be derived into the aliphatic carbonyloxy groups of formula (1) may be generally from 5 to 20, preferably from 5 to 15, more preferably from 5 to 10, even more preferably from 5 to 7. In the invention, all the hydroxyl groups existing in the polyhydric alcohol may be derived into the aliphatic carbonyloxy groups of formula (1), or a part of the hydroxyl groups existing in the polyhydric alcohol may be derived into the aliphatic carbonyloxy groups of formula (1). In the latter case, preferably, the remaining hydroxyl groups are derived into inactive groups that exhibit no reactivity in polymerization. The inactive group of the type includes, for example, an alkoxy group (preferably an alkoxy group having from 1 to 10 carbon atoms, more preferably from 1 to 6 carbon atoms, even more preferably from 1 to 3 carbon atoms, concretely including a methoxy group and an ethoxy group), and an aliphatic carbonyloxy group except formula (1) (preferably an acyloxy group having from 1 to 10 carbon atoms, more preferably from 1 to 6 carbon atoms, even more preferably from 1 to 3 carbon atoms, concretely including an acetyloxy group). Preferred is an alkoxy group.

In formula (1), R represents a hydrogen atom or a methyl group, and any of these is preferred herein.

In formula (1), n is 0 or 1. When n is 0, the group of formula (1) is an acrylate group or a methacrylate group. However, at least 3 hydroxyl groups in the polyhydric alcohol must be derived into the aliphatic carbonyloxy groups of formula (1), where n=1. The number of the hydroxyl groups to be derived into the aliphatic carbonyloxy groups, where n=1, is preferably at least 4, more preferably at least 5; and even more preferably, all the hydroxyl groups existing in the polyhydric alcohol are derived into the groups of formula (1), where n=1. In case where the aliphatic carbonyloxy groups of formula (1), where n=1, and other groups exist in the monomer, their configuration is not specifically defined.

In formula (1), L represents a linking group having a chain length of at least 4 atoms. The wording "having a chain length of at least 4 atoms" as referred to herein means that the number of the carbon atoms existing between one end and the other end of the linking group is at least 4. The linking group is preferably a linking group of an alkylene group alone, a linking group composed of an alkylene group and an ether group, a linking group composed of an alkylene group and a carbonyl group, or a linking group composed of an alkylene group, an ether group and a carbonyl group; more preferably a linking group of an alkylene group alone, or a linking group composed of an alkylene group, an ether group and a carbonyl group; even more preferably a linking group of an alkylene group alone. The linking group of an alkylene group alone includes an n-pentylene group, an n-hexylene group, an n-heptylene group, an n-octylene group, and an n-nonylene group. It is preferably an n-pentylene group or an n-hexylene group. The linking group composed of an alkylene group, an ether group and a carbonyl group is, for example, an alkylenecarbonyloxyalkylene group. This may have a structure of at least two alkylenecarbonyloxy groups bonding to each other as a whole of (O—CO—L). Concretely, as a whole of (O—CO—L), there may be mentioned a di(ethylenecarbonyloxy) group, a tri(ethylenecarbonyloxy) group, a tetra(ethylenecarbonyloxy) group, a di(propylenecarbonyloxy) group, a tri(propylenecarbonyloxy) group, a tetra(propylenecarbonyloxy) group, a di(butylenecarbonyloxy) group, a tri(butylenecarbonyloxy) group, a tetra(butylenecarbonyloxy) group, a di(pentylenecarbonyloxy) group, a tri(pentylenecarbonyloxy) group, a tetra(pentylenecarbonyloxy) group, a di(hexylenecarbonyloxy) group, and a tri(hexylenecarbonyloxy) group, a tetra(hexylenecarbonyloxy) group.

The monomer for use in the invention has at least 3 aliphatic carbonyloxy groups of formula (1), where n is 1. The linking groups represented by L in those aliphatic carbonyloxy groups may be all the same or differ; but preferably, they are all the same.

(Examples of Monomer)

As the monomer more preferably usable in the invention, there are mentioned A-1 to A-9, and B-1 to B-12 in the following. However, the monomer usable in the invention should not be limited to these.

Monomers A-1 to A-9 are represented by the following general formula (A), in which the values of a, b and m are shown in Table 1.

TABLE 1

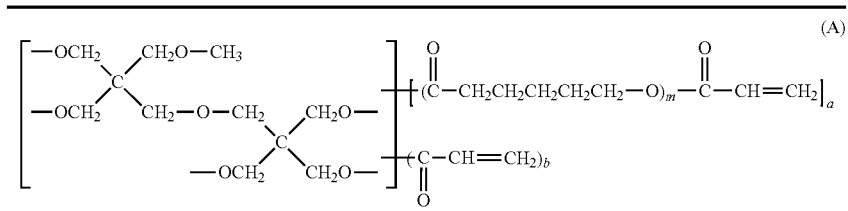

| Monomer | a | b | m |
|---|---|---|---|
| A-1 | 3 | 2 | 1 |
| A-2 | 4 | 1 | 1 |
| A-3 | 5 | 0 | 1 |
| A-4 | 3 | 2 | 0 |

TABLE 1-continued

| | | | |
|---|---|---|---|
| A-5 | 4 | 1 | 0 |
| A-6 | 5 | 0 | 0 |
| A-7 | 3 | 2 | 2 |
| A-8 | 4 | 1 | 2 |
| A-9 | 5 | 0 | 2 |

Monomers B-1 to B-12 are represented by the following general formula (B), in which the values of a, b and m are shown in Table 2.

TABLE 2

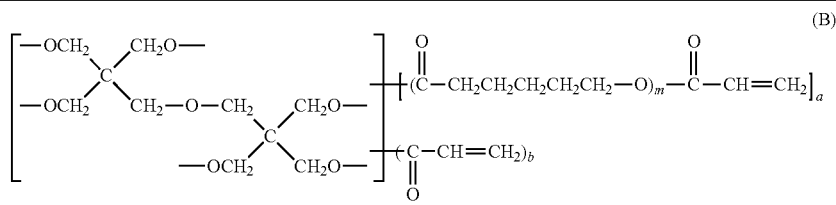

| Monomer | a | b | m |
|---|---|---|---|
| B-1 | 3 | 3 | 1 |
| B-2 | 4 | 2 | 1 |
| B-3 | 5 | 1 | 1 |
| B-4 | 6 | 0 | 1 |
| B-5 | 3 | 3 | 0 |
| B-6 | 4 | 2 | 0 |
| B-7 | 5 | 1 | 0 |
| B-8 | 6 | 0 | 0 |
| B-9 | 3 | 3 | 2 |
| B-10 | 4 | 2 | 2 |
| B-11 | 5 | 1 | 2 |
| B-12 | 6 | 0 | 2 |

(Polymerizing Ingredient)

The resin for use in the organic layer may be prepared by polymerizing and curing a polymerizing ingredient that contains the above-mentioned monomer. The polymerizing ingredient may contain any other monomer than the above-mentioned monomer, along with the above-mentioned monomer. In the polymerizing ingredient, the ratio of the above-mentioned monomer is preferably from 50 to 100% by mass, more preferably from 60 to 95% by mass, even more preferably from 70 to 90% by mass.

Not specifically defined, the other monomer than the above-mentioned monomer that may be used herein may be any one not too much detracting from the object of the invention. Preferably, it includes acrylates and methacrylates. As specific examples of the acrylates and the methacrylates, preferred are the compounds described in U.S. Pat. No. 6,033,628 and 6,214,422. Some of them are shown below.

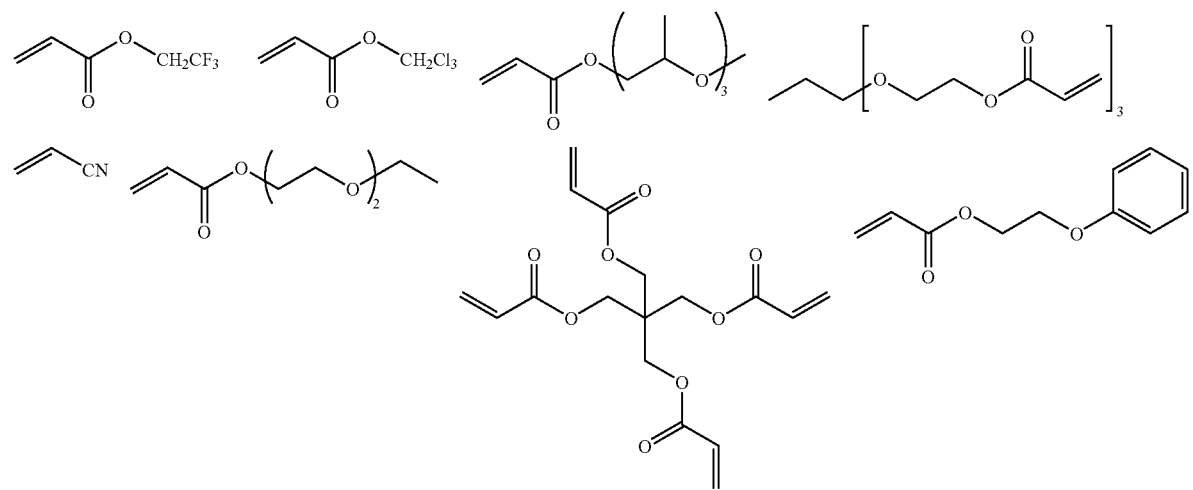

-continued
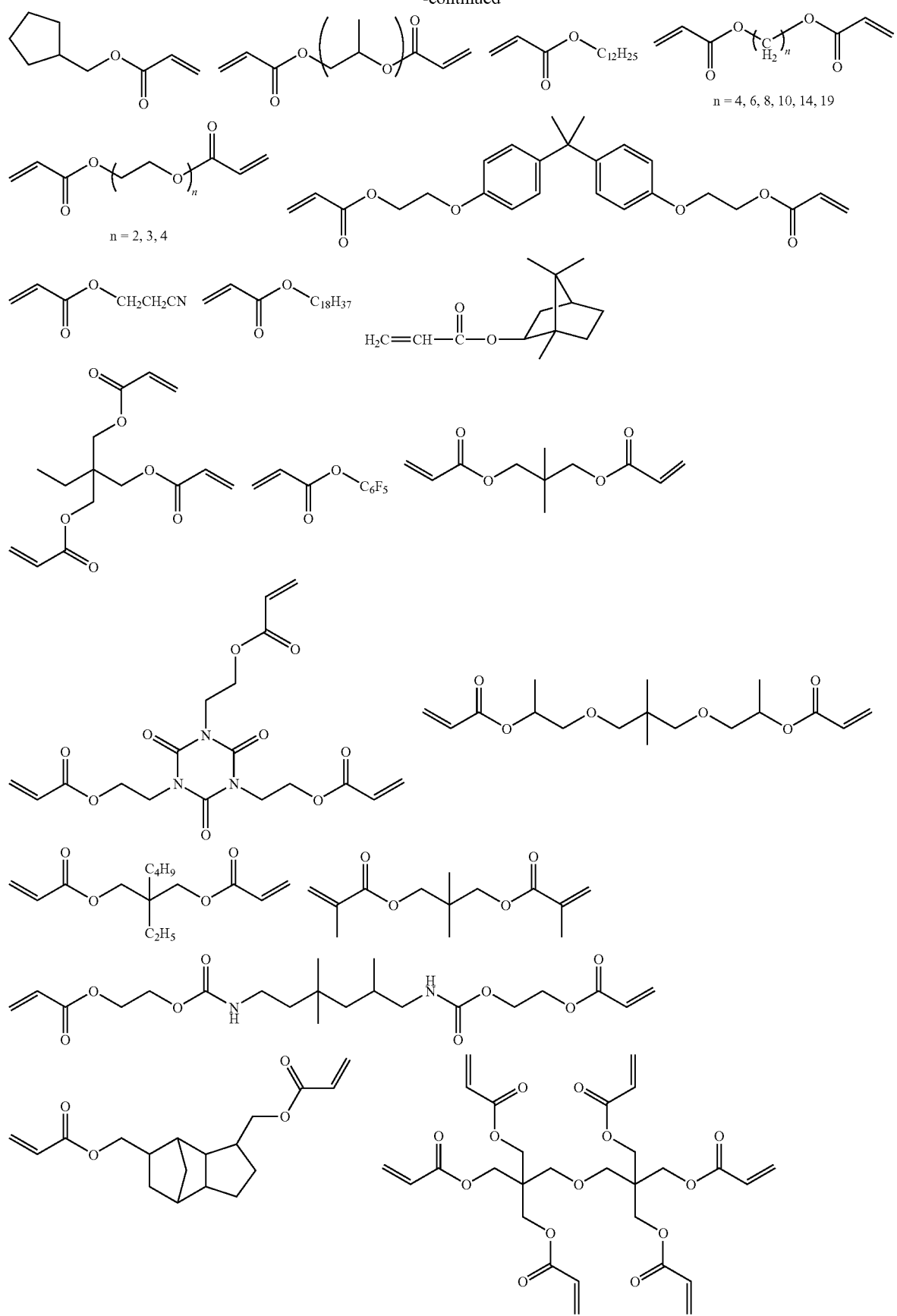

-continued
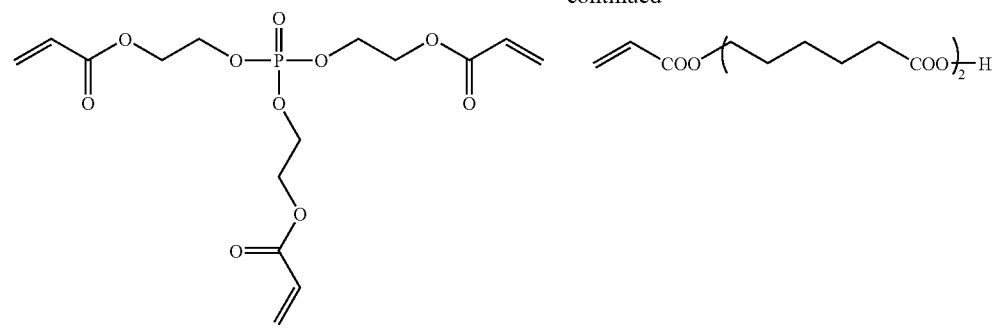
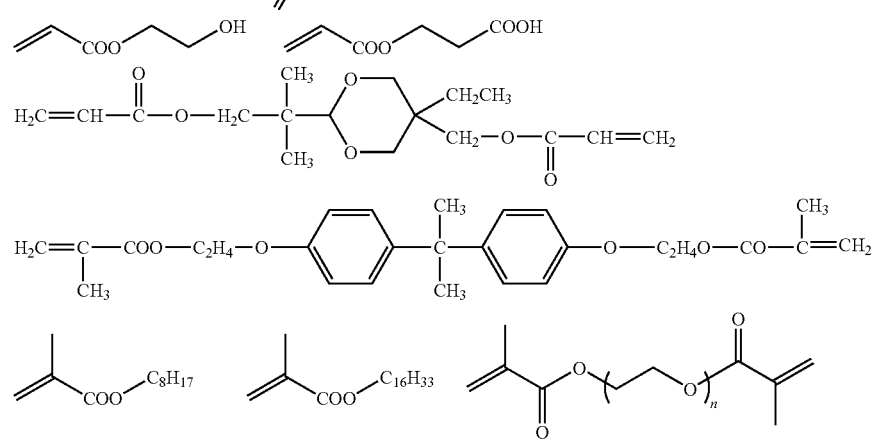
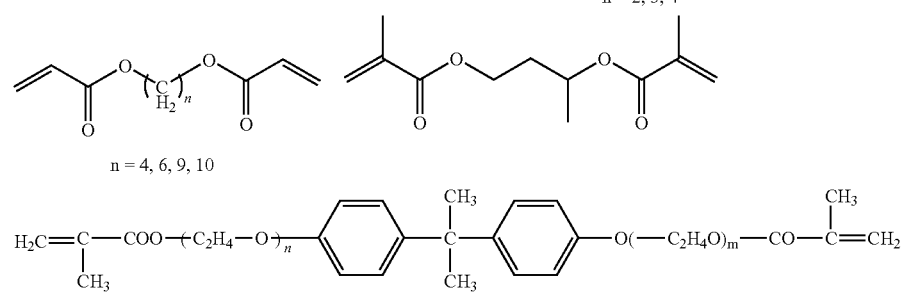
molecular weight = 572, molecular weight = 660, molecular weight = 808
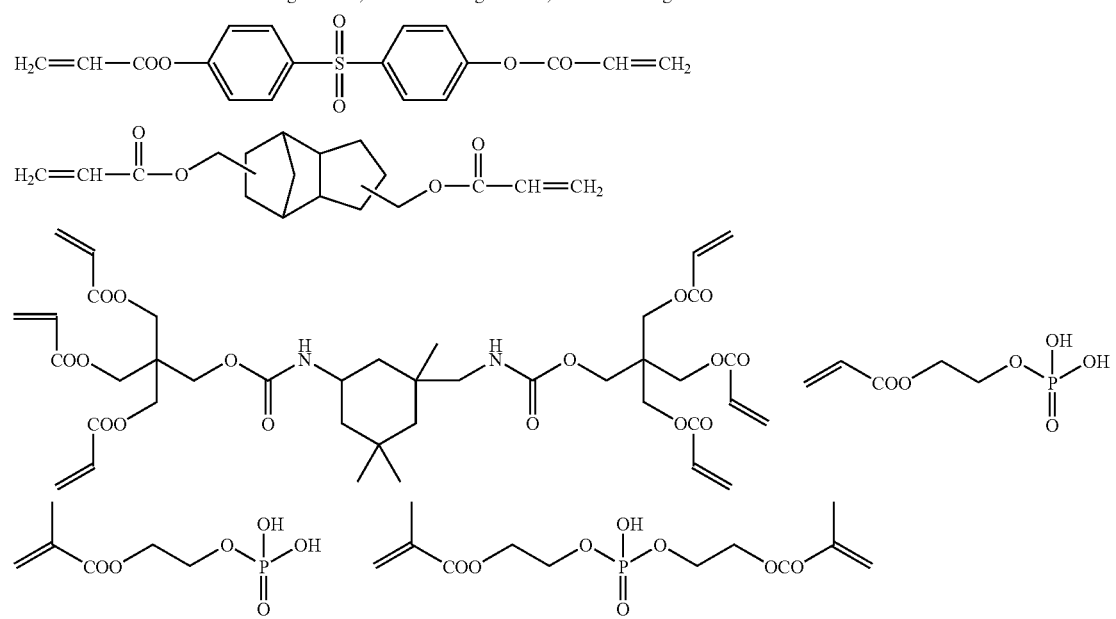

-continued

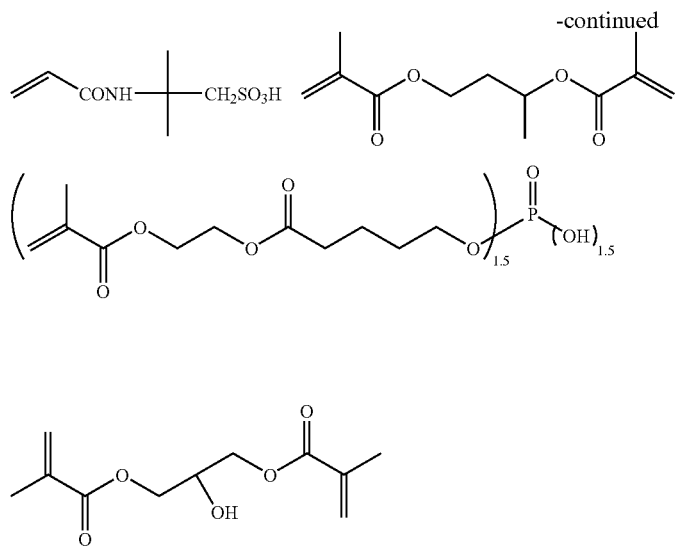
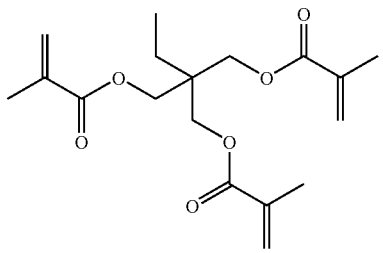

(Polymerization)

The polymerization method for the polymerizing ingredient containing the monomer is not specifically defined, for which, for example, preferred is thermal polymerization, light (UV, visible ray) polymerization, electronic beam polymerization, plasma polymerization or their combination.

In thermal polymerization, the plastic film as the substrate must have suitable heat resistance. In this case, the glass transition temperature (Tg) of the plastic film must be higher at least than the heating temperature.

In photopolymerization, a photopolymerization initiator may be used. Examples of the photopolymerization initiator are Irgacure series (e.g., Irgacure 651, Irgacure 754, Irgacure 184, Irgacure 2959, Irgacure 907, Irgacure 369, Irgacure 379, Irgacure 819) sold by Ciba Specialty Chemicals; Darocure series (e.g., Darocure TPO, Darocure 1173); Quantacure PDO; Esacure series (e.g., Esacure TZM, Esacure TZT) and sold by Sartomer.

The light for irradiation is generally UV light from high-pressure mercy lamp or low-pressure mercy lamp. The irradiation energy is preferably at least 0.5 J/cm$^2$, more preferably at least 2 J/cm$^2$. Since acrylate and methacrylate receive polymerization inhibition by oxygen in air, it is desirable that the oxygen concentration or the oxygen partial pressure during the monomer polymerization is reduced. In case where the oxygen concentration in polymerization is reduced according to a nitrogen-purging method, the oxygen concentration is preferably at most 2%, more preferably at most 0.5%. In case where the partial oxygen pressure in polymerization is reduced according to a pressure reduction method, the overall pressure is preferably at most 1000 Pa, more preferably at most 100 Pa. Especially preferred is UV polymerization with energy irradiation of at least 2 J/cm$^2$ under a reduced pressure condition of at most 100 Pa.

Preferably, the monomer rate of polymerization is at least 96%, more preferably at least 98%. The rate of polymerization as referred to herein means the ratio of the reacted polymerizing group to all the polymerizing groups (acryloyl group and methacryloyl group) in the monomer mixture.

(Method for Formation of Organic Layer)

For forming the organic layer, employable are ordinary solution coating method and vacuum film formation method. The solution coating method includes, for example, a dip coating method, an air knife coating method, a curtain coating method, a roller coating method, a wire bar coating method, a gravure coating method, a slide coating method, and an extrusion coating method of using a hopper as in U.S. Pat. No. 2,681,294. Not specifically defined, the vacuum film formation method is preferably a film formation method of vapor deposition or plasma CVD. In the invention, a polymer may be applied according to a solution coating method, or according to an inorganic substance-combined hybrid coating method as in JP-A 2000-323273 and JP-A-2004-25732.

The polymerization for resin formation may be attained before or during the formation of the organic layer. In case where the resin formation is attained during the formation of the organic layer, a monomer or a polymer precursor such as an oligomer after monomer polymerization may be applied onto or form a film on a plastic film, and thereafter this may be polymerized.

Not specifically defined, the thickness of the organic layer is preferably within a range of from 50 nm to 5000 nm, more preferably from 100 nm to 3000 nm, even more preferably from 200 to 2000 nm. Two or more organic layers may be laminated. In this case, the constitutive layers may have the same composition or may have different compositions. The organic layer in the invention may not have a definite interface to the adjacent inorganic layer, as in the embodiment disclosed in USP-A 2004-46497, and its composition may continuously change in the thickness direction of the layer.

[Inorganic Layer]

(Method for Formation of Inorganic Layer)

The inorganic layer to constitute the gas-barrier film of the invention is generally a layer of a thin film of a metal compound. For forming the inorganic layer, employable is any method capable of forming the intended thin film. For example, a coating method, a sputtering method, a vacuum vapor deposition method, an ion-plating method, a plasma CVD method and the like are suitable for it; and concretely, the methods for film formation described in Japanese Patent 3400324, JP-A 2002-322561 and 2002-361774 are usable herein.

(Ingredients and Thickness of Inorganic Layer)

Not specifically defined, the ingredients of the inorganic layer may be any ones satisfying the above-mentioned capabilities, for which, for example, employable are oxides, nitrides, carbides, oxinitrides, oxicarbides, nitrocarbides, oxinitrocarbides and others containing at least one metal selected from Si, Al, In, Sn, Zn, Ti, Cu, Ce and Ta. Of those, preferred are oxides, nitrides and oxinitrides of a metal selected from Si, Al, In, Sn, Zn and Ti; and more preferred are metal oxides, nitrides or oxinitrides of Si or Al. These may contain any other element as a side component.

Not specifically defined, the thickness of the inorganic layer is preferably within a range of from 2 nm to 300 nm, more preferably within a range of from 5 nm to 200 nm. Two or more inorganic layers may be laminated. In this case, the constitutive layers may have the same composition or may have different compositions. The inorganic layer in the invention may not have a definite interface to the adjacent organic layer, as in the embodiment disclosed in USP-A 2004-46497, and its composition may continuously change in the thickness direction of the layer.

[Functional Layer]

The gas-barrier film of the invention may have a functional layer on the barrier layer. Examples of the functional layer are the same as those mentioned in the section of the plastic film.

[Capability of Gas-Barrier Film]

(Gas-Barrier Property)

The gas-barrier film of the invention has an excellent gas-barrier property. When not folded, the moisture permeability of the gas-barrier film of the invention could be at most 0.005 g/m$^2$·day, preferably at most 0.004 g/m$^2$·day, more preferably at most 0.003 g/m$^2$·day. Even when folded, the gas-barrier film of the invention still maintains its excellent gas-barrier property. After folded to have a radius of curvature of 20 mm, the water vapor permeability of the gas-barrier film of the invention could be still at most 0.005 g/m$^2$·day, preferably at most 0.004 g/m$^2$·day, more preferably at most 0.003 g/m$^2$·day. When folded to have a radius of curvature of 30 mm, the water vapor permeability of the gas-barrier film could be also at most 0.005 g/m$^2$·day, preferably at most 0.004 g/m$^2$·day, more preferably at most 0.003 g/m$^2$·day.

Adhering to no theory, such a good gas-barrier property of the gas-barrier film of the invention may be because of the use of a monomer having a large number of functional groups in resin production for the organic layer of the film and because of the sufficient polymerization of the monomer. Specifically, it may be considered that the gas-barrier film of the invention does not have any insufficiently polymerized oligomer remaining therein that may cause thermal deformation in organic layer formation therein to give defects, thereby worsening the gas-barrier property of the film, and the gas-barrier film of the invention is free from such problems.

(Flexibility)

The gas-barrier film of the invention has excellent flexibility, and may be folded well. Adhering to no theory, the excellent flexibility of the gas-barrier film of the invention may be because the bonding chain of the monomer used in resin production for the organic layer is relatively long and therefore the freeness of the functional groups in the layer may be increased. In general, in case where the number of the functional groups in the monomer used increases, an organic layer having a high hardness and a good surface smoothness can be formed; however, since the layer is hard, the film could not have sufficient folding resistance. Contrary to this, the invention has realized good flexibility of the gas-barrier film.

As having the above-mentioned excellent properties, the gas-barrier film of the invention can be effectively used for sealing of objects having projections or recesses or having flections.

(Smoothness)

The surface of the inorganic layer formed on the organic layer of the gas-barrier film of the invention has high smoothness. The center line mean roughness of the inorganic layer may be at most 2.0 nm, preferably at most 1.7 nm, more preferably at most 1.5 nm. Since the layer formed on such a smooth inorganic layer may also be smooth, the surface smoothness of the gas-barrier film of the invention is good. Adhering to no theory, the good smoothness of the gas-barrier film of the invention may be because of the use of a monomer having a large number of functional groups in resin production for the organic layer and because of the sufficient polymerization of the monomer. Specifically, it may be considered that the gas-barrier film of the invention is free from the problem of an insufficiently polymerized oligomer remaining therein to cause thermal deformation in organic layer formation thereby worsening the surface smoothness of the formed inorganic layer.

[Environment-Sensitive Device]

(Use of Gas-Barrier Film)

The gas-barrier film of the invention has many applications. Above all, it is favorably used for environment-sensitive devices.

The environment-sensitive device of the invention means a device of which the properties change as influenced by the substances existing in the environment, for example, oxygen and moisture therein; and for example, it includes image display element, organic memory, organic cell, organic solar cell, etc. The image display element in the invention is meant to include circular polarizer, liquid-crystal display element, touch panel, organic EL device, etc. Each of the environment-sensitive devices is explained in detail below.

(Circularly Polarizing Plate)

The circularly polarizing plate can be prepared by laminating a λ/4 plate and a polarizing plate on the gas-barrier film of the invention. In that case, the both plates are laminated in such a manner that a slow axis of the λ/4 plate and an absorption axis of the polarizing plate form 45°. As such a polarizing plate, one stretched in a direction of 45° against the machine direction (MD) thereof is preferably used, and those described in, for example, JP-A-2002-865554 can be favorably used.

(Liquid Crystal Display Device)

The reflection type liquid crystal display device is configured to include a lower substrate, a reflection electrode, a lower alignment film, a liquid crystal layer, an upper alignment film, a transparent electrode, an upper substrate, a λ/4 plate and a polarizing film in order from the lower side. The gas-barrier film of the invention can be used as the transparent electrode and the upper substrate. In the case of giving a color displaying function to the reflection type liquid crystal display device, it is preferable to further provide a color filter layer between the reflection electrode and the lower alignment film or between the upper alignment film and the transparent electrode.

Also, the transmission type liquid crystal display device is configured to include a backlight, a polarizing plate, a λ/4 plate, a lower transparent electrode, a lower alignment film, a liquid crystal layer, an upper alignment film, an upper transparent electrode, an upper substrate, a λ/4 plate and a polarizing plate in order from the lower side. Of these, the gas-barrier film of the invention can be used as the upper transparent electrode and the upper substrate. Also, in the case of giving a color displaying function to the transmission type liquid crystal display device, it is preferable to further provide a color filter layer between the lower transparent electrode and the lower alignment film or between the upper alignment film and the upper transparent electrode.

Though the structure of the liquid crystal layer is not particularly limited, it is preferably of, for example, a TN (twisted nematic) type, an STN (super twisted nematic) type, an HAN (hybrid aligned nematic) type, a VA (vertically alignment) type, an ECB (electrically controlled birefringence) type, an OCB (optically compensated bend) type, a CPA (continuous pinwheel alignment) type or an IPS (in-plane switching) type.

(Touch Panel)

As the touch panel, one obtained by applying the gas-barrier film of the invention onto a substrate described in, for example, JP-A-5-127822 or JP-A-2002-48913 can be used.

(Organic EL Device)

An organic EL device means an organic electroluminescent device. The gas-barrier film of the invention preferably employed as a sealing film of the organic EL device. The organic EL device has a cathode and an anode on a substrate and has an organic compound layer including an organic light-emitting layer between the both electrodes. In view of properties of the light-emitting device, it is preferable that at least one electrode of the anode and the cathode is transparent.

In the invention, an embodiment of the laminate of the organic compound layer is preferably an embodiment in which a hole transport layer, a light-emitting layer and an electron transport layer are laminated in order from the anode side. Furthermore, a charge blocking layer may be provided between the hole transport layer and the light-emitting layer or between the light-emitting layer and the electron transport layer. A hole injection layer may be provided between the anode and the hole transport layer; and an electron injection layer may be provided between the cathode and the electron transport layer. Each of the layers may be divided into plural secondary layers.

Hereinafter, each element constituting the organic EL device is described in detail.

(1) Substrate

As the substrate for use in the organic EL device of the invention, usable is a substrate for use in known organic EL devices. The substrate may be resin film or gas-barrier film. Also, preferably used is gas-barrier film described in JP-A-2004-136466, JP-A-2004-148566, JP-A-2005-246716 and JP-A-2005-262529 as well as the gas-barrier film of the present invention.

The thickness of the substrate for use in the invention is not specifically limited, and is preferably 1 μm to 800 μm, more preferably 10 μm to 500 μm, further more preferably 20 μm to 300 μm. In each case, the haze value of the substrate is preferably 3% or less, more preferably 2% or less, and further more preferably 1% or less. The all transmission of the substrate is preferably 70% or more, more preferably 75% or more, and further more preferably 80% or more.

(2) Anode

In general, the anode may have a function as an electrode capable of supplying a hole into the organic compound layer and is not particularly limited as to its shape, structure and size or the like. The anode can be properly chosen among known electrode materials depending upon the use and purpose of the light-emitting device. As described previously, the anode is usually provided as a transparent anode. The transparent anode is described in detail in New Developments of Transparent Conducting Films, supervised by SAWADA, Yutaka (published by CMC Publishing Co., Ltd., 1999). In the case of using a plastic base material with low heat resistance, a transparent anode obtained through fabrication at a low temperature of not higher than 150° C. using ITO or IZO is preferable.

(3) Cathode

In general, the cathode may have a function as an electrode capable of injecting an electron into the organic compound layer and is not particularly limited as to its shape, structure and size or the like. The cathode can be properly chosen among known electrode materials depending upon the use and purpose of the light-emitting device.

As materials constituting the cathode, for example, metals, alloys, metal oxides, electric conductive materials or mixtures thereof can be exemplified. Specific examples thereof include divalent metals (for example, Mg and Ca), gold, silver, lead, aluminum, a lithium-aluminum alloy, a magnesium-silver alloy, and rare earth metals such as indium and ytterbium. Though these materials may be used singly, from the standpoint of making stability and electron injection properties compatible with each other, two or more kinds of these materials can be favorably used in combination.

Of these, the material constituting the cathode is preferably a material composed mainly of aluminum.

The material composed mainly of aluminum refers to aluminum alone or an alloy of aluminum and from 0.01 to 10% by mass of an alkali metal or an alkaline earth metal or a mixture thereof (for example, a lithium-aluminum alloy and a magnesium-aluminum alloy). The cathode material is described in detail in JP-A-2-15595 and JP-A-5-121172. Also, a dielectric layer composed of a fluoride or oxide of an alkali metal or alkaline earth metal or the like may be inserted in a thickness of from 0.1 to 5 nm between the cathode and the organic compound layer. This dielectric layer can be considered as a certain kind of the electron injection layer.

The thickness of the cathode can be properly chosen depending upon the material constituting the cathode and cannot be unequivocally defined. However, the thickness of the cathode is in general from about 10 nm to 5 μm, and preferably from 50 nm to 1 μm.

Also, the cathode may be transparent or opaque. The transparent cathode can be formed by thinly fabricating the cathode material in a thickness of from 1 to 10 nm and further laminating a transparent conductive material such as ITO and IZO thereon.

(4) Organic Compound Layer

The organic electroluminescent device of the invention has at least one organic compound layer including a light-emitting layer. As described previously, examples of other organic compound layers than the organic light-emitting layer include respective layers such as a hole transport layer, an electron transport layer, a charge blocking layer, a hole injection layer and an electron injection layer.

Organic Light-Emitting Layer

The organic light-emitting layer is a layer having a function such that at the time of application of an electric field, it receives a hole from the anode, the hole injection layer or the hole transport layer and receives an electron from the cathode, the electron injection layer or the electron transport layer to provide a field of recombination of the hole and the electron, thereby achieving light emission. The light-emitting layer may be constituted of only a light-emitting material or may be configured as a mixed layer of a host material and a light-emitting material. The light-emitting material may be a fluorescent light-emitting material or a phosphorescent light-emitting material; and a dopant may be a single material or a combination of two or more kinds of materials. The host material is preferably a charge transport material. The host material may be a single material or a combination of two or more kinds of materials, and examples thereof include a constitution of a mixture of an electron transporting host material and a hole transporting host material. Furthermore, the light-emitting layer may contain a material which does not have charge transporting properties and does not emit light. Also, the light-emitting layer may be a single layer or may be configured of two or more layers, and the respective layers may emit light in a different luminescent color.

Examples of the fluorescent light-emitting material which can be used in the invention include compounds, for example, benzoxazole derivatives, benzimidazole derivatives, benzothiazole derivatives, styrylbenzene derivatives, polyphenyl derivatives, diphenylbutadiene derivatives, tetraphenylbutadiene derivatives, naphthalimide derivatives, coumarin derivatives, condensed aromatic compounds, perynone derivatives, oxadiazole derivatives, oxazine derivatives, aldazine derivatives, pyralidine derivatives, cyclopentadiene derivatives, bisstyrylanthracene derivatives, quinacridone derivatives, pyrrolopyridine derivatives, thiadiazolopyridine derivatives, cyclopentadiene derivatives, styrylamine derivatives, diketopyrrolopyrrole derivatives, aromatic dimethylidyne derivatives, various metal complexes represented by metal complexes of 8-quinolinol derivatives and pyrromethene derivatives, polymer compounds (for example, polythiophene, polyphenylene and polyphenylenevinylene) and organosilane derivatives.

Examples of the phosphorescent light-emitting material include complexes containing a transition metal atom or a lanthanoid atom.

The transition metal atom is not particularly limited, and preferred examples thereof include ruthenium, rhodium, palladium, tungsten, rhenium, osmium, iridium and platinum, with rhenium, iridium and platinum being more preferable.

Examples of the lanthanoid atom include lanthanum, cerium, praseodymium, neodymium, samarium, europium, gadolinium, terbium, dysprosium, holmium, erbium, thulium, ytterbium and lutetium. Of these lanthanoid atoms, neodymium, europium and gadolinium are preferable.

Examples of a ligand of the complex include ligands described in G. Wilkinson, et al., *Comprehensive Coordination Chemistry*, published by Pergamon Press, 1987; H. Yersin, *Photochemistry and Photophysics of Coordination Compounds*, published by Springer-Verlag, 1987; and YAMAMOTO, Akio, *Organometallic Chemistry—Principles and Applications*, published by Shokabo Publishing Co., Ltd., 1982.

Also, examples of the host material which is contained in the light-emitting layer in the invention include materials as enumerated in the following paragraphs of hole injection layer, hole transport layer, electron injection layer and electron transport layer as well as a material having a carbazole skeleton, a material having a diarylamine skeleton, a material having a pyridine skeleton, a material having a pyrazine skeleton, a material having a triazine skeleton and a material having an arylsilane skeleton.

Hole Injection Layer and Hole Transport Layer

The hole injection layer and the hole transport layer are each a layer having a function to receive a hole from the anode or the anode side to transport it into the cathode side. Specifically, the hole injection layer and the hole transport layer are each preferably a layer containing a carbazole derivative, a triazole derivative, an oxazole derivative, an oxadiazole derivative, an imidazole derivative, a polyarylalkane derivative, a pyrazoline derivative, a pyrazolone derivative, a phenylenediamine derivative, an arylamine derivative, an amino-substituted chalcone derivative, a styrylanthracene derivative, a fluorenone derivative, a hydrazone derivative, a stilbene derivative, a silazane derivative, an aromatic tertiary amine compound, a styrylamine compound, an aromatic dimethylidene based compound, a porphyrin based compound, an organosilane derivative, carbon or the like.

Electron Injection Layer and Electron Transport Layer

The electron injection layer and the electron transport layer are each a layer having a function to receive an electron from the cathode or the cathode side to transport it into the anode side. Specifically, the electron injection layer and the electron transport layer are each preferably a layer containing a triazole derivative, an oxazole derivative, an oxadiazole derivative, an imidazole derivative, a fluorenone derivative, an anthraquinodimethane derivative, an anthrone derivative, a diphenylquinone derivative, a thiopyran dioxide derivative, a carbodiimide derivative, a fluorenylidenemethane derivative, a distyrylpyrazine derivative, aromatic ring tetracarboxylic acid anhydrides of naphthalene, perylene, etc., a phthalocyanine derivative, a metal complex of every kind represented by metal complexes of 8-quinolinol derivatives and metal complexes composed of, as a ligand, metal phthalocyanine, benzoxazole or benzothiazole, an organosilane derivative or the like.

Hole Blocking Layer

The hole blocking layer is a layer having a function to prevent a phenomenon in which the hole which has been transported into the light-emitting layer from the anode side passes through into the cathode side from occurring. In the invention, the hole blocking layer can be provided as an organic compound layer which is positioned adjacent to the light-emitting layer on the cathode side.

Examples of an organic compound constituting the hole blocking layer include aluminum complexes such as BAlq, triazole derivatives and phenanthroline derivatives such as BCP. Also, a layer having a function to prevent a phenomenon in which the electron which has been transported into the light-emitting layer from the cathode side passes through into the anode side from occurring may be provided on the position adjacent to the light-emitting layer on the anode side. The hole injection layer and hole transport layer may serve this function.

(Solar Cell)

The gas-barrier film of the invention can be used also as a sealing film for solar cell devices. Preferably, the gas-barrier film of the invention is used for sealing a solar cell device in such a manner that its adhesive layer is on the side near to the solar cell device. The solar cell devices for which the gas-barrier film of the invention is favorably used are not specifically defined. For example, they include single crystal silicon-based solar cell devices, polycrystalline silicon-based solar cell devices, single-junction or tandem-structure amorphous silicon-based solar cell devices, gallium-arsenic (GaAs), indium-phosphorus (InP) or the like III-V Group compound semiconductor-based solar cell devices, cadmium-tellurium (CdTe) or the like II-VI Group compound semiconductor-based solar cell devices, copper/indium/selenium (CIS-based), copper/indium/gallium/selenium (CIGS-based), copper/indium/gallium/selenium/sulfur (CIGSS-based) or the like I-III-VI Group compound semiconductor-based solar cell devices, dye-sensitized solar cell devices, organic solar cell devices, etc. Above all, in the invention, the solar cell devices are preferably copper/indium/selenium (CIS-based), copper/indium/gallium/selenium (CIGS-based), copper/indium/gallium/selenium/sulfur (CIGSS-based) or the like I-III-VI Group compound semiconductor-based solar cell devices.

(TFT Display Element)

The gas-barrier film of the invention is usable as a substrate for thin-film transistor (TFT) image display devices. For fabricating TFT arrays, there are mentioned the method described in JP-T 10-512104, etc. The substrate may have a color filter for color display. The color filter may be formed in any method, but preferably through photolithography.

EXAMPLES

The characteristics of the invention are described more concretely with reference to the following Examples and Comparative Examples. In the following Examples, the material used, its amount and the ratio, the details of the treatment and the treatment process may be suitably modified or changed not overstepping the sprit and the scope of the invention. Accordingly, the invention should not be limitatively interpreted by the Examples mentioned below.

Example 1

Production and Evaluation of Gas-Barrier Film

Gas-barrier films (samples Nos. 1 to 7) were produced according to the process mentioned below, each having an organic layer and an inorganic layer formed on a plastic film of a flexible supporting substrate. The details of the constitution of each gas-barrier film are shown in Table 3. As the plastic film, used was a polyethylene naphthalate film (PEN, thickness 100 μm, Teijin-DuPont's Q65FA).

(Formation of Easy-Adhesive Layer)

Only in the sample No. 4 shown in Table 3, a two-layered easy-adhesive layer was formed on the plastic film according to the following process.

A dispersion prepared by dispersing a polyester resin binder (Dai-Nippon ink Chemical Industry's Finetex ES-650) in water with a surfactant therein was applied onto the plastic film and dried to form a first easy-adhesive layer having a thickness of 200 nm. Next, a dispersion prepared by dispersing an acrylic resin binder (latex of $MMA_{59}$-$St_9$-$2EHA_{26}$-$HEMA_5$-$AA_1$, having a solid concentration of 28%) in water with a surfactant therein was applied onto the first easy-adhesive layer and dried to form thereon a second easy-adhesive layer having a thickness of 200 nm.

(Formation of Organic Layer)

20 g of the photopolymerizing monomer shown in Table 3 and 0.6 g of a photopolymerization initiator (Ciba Specialty Chemicals' Irgacure 907) were dissolved in 190 g of methyl ethyl ketone to prepare a coating liquid. Using a wire bar, the coating liquid was applied onto the plastic film, and under nitrogen purging to an oxygen concentration of at most 0.1%, this was irradiated with UV rays at an illuminance of 350 mW/cm$^2$ and at a radiation dose of 500 MJ/cm$^2$, using an air-cooling metal halide lamp of 160 W/cm (by Eyegraphics), thereby forming an organic layer thereon. The film thickness was about 500 nm.

(Formation of Inorganic Layer)

The pressure in the vacuum chamber of a reactive sputtering apparatus was reduced to an ultimate vacuum degree of $5\times10^{-4}$ Pa, by driving the oil rotary pump and the turbomolecular pump thereof. Next, argon was introduced into it as a plasma gas; and a power of 2000 W was applied to it from a plasma source. A high-purity oxygen gas was introduced into the chamber, and the film formation pressure was controlled at 0.3 Pa for a predetermined period of time to form an inorganic layer of aluminium oxide. Thus formed, the aluminium oxide film had a thickness of 40 nm and a film density of 3.01 g/cm$^3$.

(Evaluation of Physical Properties of Gas-Barrier Film)

The physical properties of the gas-barrier film were evaluated according to the methods mentioned below. The results are shown in Table 3.

(1) Film Thickness:

An ultra-thin piece of a film sample was observed with a scanning electromicroscope, Hitachi's "S-900 Model".

(2) Film Density of Inorganic Layer:

An inorganic layer was formed on a Si wafer to prepare a test sample, and this was analyzed with Rigaku Denki's ATX-G (for X-ray reflectiometry). From the measured data, the film density of the thin film of the inorganic layer was calculated.

(3) Water Vapor Permeability:

MOCON's "PERMATRAN-W3/31" (condition: 40° C., 90% RH) was used. The data lower than the detection limit of the MOCON's apparatus, 0.01 g/m$^2$/day were supplemented according to the following method. First, the surface of the gas-barrier film is directly coated with a metal Ca through vapor deposition, then the film and a glass substrate are sealed up with a commercially-available organic EL sealant in such a manner that the Ca-coated surface of the film could face inside, thereby preparing a test sample. Next, the test sample is kept under the above-mentioned temperature/humidity condition, and the metal Ca coating on the gas-barrier film is checked for the optical density change thereof (the metal gloss reduces owing to hydroxylation or oxidation), from which the water vapor permeability through the film is determined.

The water vapor permeability of the gas-barrier film is measured after just formed and after folded to have a radius of curvature of 20 mm and 30 mm, respectively.

(4) Rate of Polymerization:

From the ratio of the absorption intensity based on the carbonyl group at around 1720 cm$^{-1}$ and to the absorption intensity based on the carbon-carbon double bond at around 810 cm$^{-1}$ in the IR spectrum of the cured film and the monomer mixture, the rate of polymerization was calculated according to the following calculation formula 1:

$$\text{Rate of polymerization (\%)} = \{(a \times d - b \times c)/a \times d\} \quad \text{Calculation Formula 1}$$

wherein, a is the peak intensity of the cured film at around 1720 cm$^{-1}$;

b is the peak intensity of the cured film at around 810 cm$^{-1}$;

c is the peak intensity of the monomer mixture at around 1720 cm$^{-1}$;

d is the peak intensity of the monomer mixture at around 810 cm$^{-1}$.

(5) Measure of Surface Roughness:

Regarding the surface roughness of the organic layer formed, the layer was analyzed with an atomic force microscope (AFM) for the surface smoothness. In this case, the smoothness was expressed as a mean roughness Ra (unit, nm) within a sample area of 1 μm square. The apparatus used was SPI3800N/SPA400 (by STI Nanotechnology); and the cantilever used was SI-DF20. Regarding the condition, the operation frequency was 1 Hz, and the number of the X and Y data was 256 lines.

TABLE 3

| Sample No. | Easy-adhesive layer | Monomer Formula | a | b | m | Remarks | Rate of polymerization (%) | Surface roughness of inorganic layer (nm) | Water Vapor Permeability (g/m² · day) non-folded | radius of curvature of 30 mm | radius of curvature of 20 mm | Remarks |
|---|---|---|---|---|---|---|---|---|---|---|---|---|
| 1 | X | Formula(A) | 3 | 2 | 1 | Exemplified compound A-1 | 97 | 2.0 | 0.005 | 0.005 | 0.005 | Example |
| 2 | X | Formula(A) | 5 | 0 | 1 | Exemplified compound A-3 | 98 | 1.5 | 0.003 | 0.004 | 0.005 | Example |
| 3 | X | Formula(B) | 6 | 0 | 1 | Exemplified compound B-4 | 98 | 1.5 | 0.003 | 0.003 | 0.004 | Example |
| 4 | ○ | Formula(A) | 5 | 0 | 1 | Exemplified compound A-3 | 98 | 1.5 | 0.003 | 0.003 | 0.003 | Example |
| 5 | X | Formula(C) | — | — | — | Bifunctional acrylate | 98 | 2.0 | 2.8 | 3.0 | 3.5 | Comparative Example |
| 6 | X | Formula(B) | 0 | 6 | 0 | The monomer recited in JP-A-2002-264274 | 90 | 3.0 | 0.3 | 0.4 | 0.5 | Comparative Example |
| 7 | X | Formula(A) | 2 | 3 | 1 | Comparative monomer which is low in a | 95 | 2.5 | 0.1 | 0.1 | 0.2 | Comparative Example |

As is obvious from Table 3, it is confirmed that, when a resin prepared by curing a polymerizing ingredient containing a monomer having a specific structure is used according to the invention, then the gas-barrier film has a good gas-barrier property and even when folded, it keeps its excellent gas-barrier property. In addition, it is also confirmed that the gas-barrier film of the invention has excellent flexibility and surface smoothness.

Example 2

Production and Evaluation of Gas-Barrier Film

A gas-barrier film was produced and evaluated in the same manner as in Example 1, for which, however, a polyethylene terephthalate film (PET, thickness 100 μm, Toray's product, Lumirror T60) was used in place of the polyethylene naphthalate film (PEN) as a plastic film for the flexible supporting substrate. This gave the same results as in Example 1.

Example 3

Production and Evaluation of Organic EL Device (Preparation of Substrate of Organic EL Device) An ITO film-having conductive glass substrate (surface resistivity, 10 Ω/square) was washed with 2-propanol, and then processed for UV ozone treatment for 10 minutes. On the substrate (anode), the following organic compound layers were formed in order by vapor deposition according to a vacuum vapor deposition method.
First Hole Transporting Layer:
Copper phthalocyanine: film thickness 10 nm.
Second Hole Transporting Layer:
N,N'-diphenyl-N,N'-dinaphthylbenzidine: film thickness 40 nm.
Light-Emitting Layer also serving as electron transporting layer:
Tris(8-hydroxyquinolinato)aluminium: film thickness 60 nm.
Finally, 1 nm of lithium fluoride and 100 nm of metal aluminium were formed in order by vapor deposition, thereby forming a cathode; and a silicon nitride film having a thickness of 3 μm was formed on it according to a parallel plate CVD method, thereby constructing an organic EL device.
(Application of Gas-Barrier Film on Organic EL Device)

Using a thermosetting adhesive (Epotec 310, by Daizo-Nichimori), the gas-barrier film of Samples Nos. 1 to 7 and the organic EL device substrate were stuck together in such a manner that the barrier layer of the film could be on the side of the organic EL device, and heated at 65° C. for 3 hours to cure the adhesive. 20 test pieces of every sample of the thus-sealed organic EL device were prepared.

(Evaluation of Light-Emitting Surface of Organic EL Device)

Just after produced, the organic EL device was tested for light emission under application of 7 V thereto, using a source measure unit (SMU2400 Model by Keithley). Using a microscope, the light-emitting surface was observed, which confirmed uniform light emission by every device with no dark spot.

Next, the devices were stored in a dark room at 60° C. and 90% RH for 24 hours, and then tested for light emission. The proportion of the test pieces that gave dark spots larger than 300 μm in diameter is defined as a failure rate. As a result, the devices sealed with any of the gas-barrier films of samples Nos. 1 to 4 of the invention gave no failures, which confirmed excellent surface emission of the samples of the invention. On the other hand, the samples Nos. 5 to 7 falling outside the scope of the invention had a failure rate of not less than 50%.

Example 4

Production and Evaluation of Organic EL Device

Using the gas-barrier film produced in Example 2 as a sealing film, sealed organic EL devices (samples Nos. 401 to 408) were produced in the same manner as in Example 3. In applying the gas-barrier layer to the organic EL device, used was a UV-curable adhesive (XNR5516HV, by Nagase-Ciba) but not a thermosetting adhesive. The adhesive was cured with UV rays in an argon gas-purged globe box to adhere the film and the device. Like in Example 3, the samples were tested and evaluated, and they gave the similar tendencies as in Example 3.

Example 5

Production of Organic EL Device with Gas-Barrier Film Serving as Substrate

The gas-barrier film (samples Nos. 1 to 4) produced in Example 1 was introduced into a vacuum chamber, in which a transparent electrode of a thin ITO film having a thickness of 0.2 μm was formed on the film by DC magnetron sputtering with an ITO target. The ITO film-having gas-barrier film was put into a washing chamber, and ultrasonically washed with 2-propanol therein, and then processed for UV-ozone treatment for 30 minutes. Using the substrate, an organic EL device was produced in the same manner as in Example 3. In the device, both the substrate and the sealing film comprise a resin as the main ingredient thereof, and therefore, the device was flexible.

INDUSTRIAL APPLICABILITY

The gas-barrier film of the invention has a good gas-barrier property, and even when folded, it still keeps its good gas-barrier property. Further, since the gas-barrier film of the invention is flexible, it can be effectively used for sealing of objects having projections or recesses or having flections. In particular, the gas-barrier film of the invention is useful for environment-sensitive devices, for example, image display devices such as organic EL devices, as well as organic memories, organic cells, organic solar cells. Accordingly, the industrial applicability and usefulness of the invention is high.

The present disclosure relates to the subject matter contained in Japanese Patent Application No. 268979/2007 filed on Oct. 16, 2007, which is expressly incorporated herein by reference in their entirety. All the publications referred to in the present specification are also expressly incorporated herein by reference in their entirety.

The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention not be limited by the specification, but be defined claims set forth below.

What is claimed is:

1. A gas-barrier film having a structure of an organic layer and an inorganic layer laminated alternately on at least one surface of a plastic film, wherein the organic layer comprises a resin obtained by polymerizing and curing a monomer, said monomer having a structure of pentahydric alcohol or polyhydric alcohol having more than five hydroxyl groups and said monomer having a molecular weight of from 200 to 800, in which at least 3 hydroxyl groups are substituted with an aliphatic carbonyloxy group of the following general formula (1):

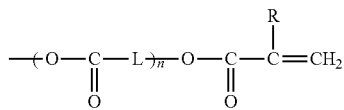

wherein R represents a hydrogen atom or a methyl group; L represents a linking group having a chain length of at least 4 atoms; n represents 1.

2. The gas-barrier film of claim 1, wherein the polyhydric alcohol is dipentaerythritol.

3. The gas-barrier film of claim 1, wherein L is a linear alkylene group having at least 4 carbon atoms.

4. The gas-barrier film of claim 1, wherein the center line mean roughness of the inorganic layer on the organic layer is at most 2.0 nm.

5. The gas-barrier film of claim 1, wherein the water vapor permeability of the gas-barrier film after folded to have a radius of curvature of 20 mm is at most 0.005 g/m$^2$·day.

6. The gas-barrier film of claim 1, wherein the organic layer has a thickness falling within a range of from 50 nm to 5000 nm.

7. The gas-barrier film of claim 1, wherein the rate of polymerization of the organic layer is at least 96%.

8. The gas-barrier film of claim 1, wherein the inorganic layer has a thickness falling within a range of from 2 to 300 nm.

9. The gas-barrier film of claim 1, wherein the plastic film has an easy-adhesive layer on the surface thereof.

10. The gas-barrier film of claim 1, wherein the plastic film has an easy-adhesive layer on the surface thereof, and the easy-adhesive layer has a two-layered structure, and the binder in the first layer adjacent to the plastic film is a polyester and the binder in the second layer just on it is an acrylic resin or an urethane resin.

11. An environment-sensitive device comprising the gas-barrier film of claim 1.

12. The environment-sensitive device of claim 11, wherein the device is an organic EL device.

13. The environment-sensitive device of claim 11, wherein the device is a solar cell.

* * * * *